US009709625B2

(12) United States Patent
Eckert et al.

(10) Patent No.: US 9,709,625 B2
(45) Date of Patent: Jul. 18, 2017

(54) MEASURING POWER CONSUMPTION IN AN INTEGRATED CIRCUIT

(75) Inventors: Martin Eckert, Boeblingen (DE);
Roland Frech, Ostfildern (DE);
Claudio Siviero, Boeblingen (DE);
Jochen Supper, Boeblingen (DE); Otto A. Torreiter, Boeblingen (DE);
Thomas-Michael Winkel, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 13/170,512

(22) Filed: Jun. 28, 2011

(65) Prior Publication Data
US 2012/0130657 A1    May 24, 2012

(30) Foreign Application Priority Data
Nov. 19, 2010    (EP) .................................... 10191823

(51) Int. Cl.
*G01R 31/28*    (2006.01)
*G01R 31/30*    (2006.01)
*G01R 31/3185*    (2006.01)

(52) U.S. Cl.
CPC ...... *G01R 31/2851* (2013.01); *G01R 31/2879* (2013.01); *G01R 31/3004* (2013.01); *G01R 31/3012* (2013.01); *G01R 31/318575* (2013.01)

(58) Field of Classification Search
CPC ............ G01R 31/2851; G01R 31/2879; G01R 31/318575; G01R 31/3012; G01R 31/3004
See application file for complete search history.

(56) References Cited

U.S. PATENT DOCUMENTS

| 5,248,967 | A | * | 9/1993 | Daneshfar | .............. | G08G 1/097 |
| | | | | | | 315/130 |
| 5,557,557 | A | * | 9/1996 | Frantz et al. | ................... | 703/22 |

(Continued)

FOREIGN PATENT DOCUMENTS

| CN | 101140597 A | 3/2008 |
| JP | 2008-058114 A | 3/2008 |

OTHER PUBLICATIONS

Unknown, "Power Management Solution Guide", 2005, Xcell Publications, Issue 1, pp. 1-72.*

(Continued)

*Primary Examiner* — Mischita Henson
(74) *Attorney, Agent, or Firm* — Heslin Rothenberg Farley & Mesiti P.C.

(57) ABSTRACT

A method for determining power consumption of a power domain within an integrated circuit is presented. In a first step, a local power supply impedance profile (Z(f)) of this power domain is determined. Subsequently, a local time-resolved power supply voltage (U(t)) is measured while a well-defined periodic activity is executed in power domain. A set of time-domain measured voltage data (U(t)) is thus accumulated and transformed into the frequency domain to yield a voltage spectrum (U(f)). A current spectrum I(t) is calculated from this voltage profile (U(f)) by using the power supply impedance profile Z(f) of this power domain as $I(t)=F_f^{-1}\{U(f)/Z(f)\}$. Finally, a time-resolved power consumption spectrum P(t) is determined from measured voltage spectrum U(t)) and calculated current spectrum (I(t)). This power consumption (P(t)) may be compared with a reference $(P_{ref}(t))$ to verify whether power consumption within power domain matches expectations.

10 Claims, 5 Drawing Sheets

(56) References Cited

U.S. PATENT DOCUMENTS

| | | | |
|---|---|---|---|
| 6,768,952 B2* | 7/2004 | Kantorovich et al. | 702/65 |
| 6,879,178 B1* | 4/2005 | Kantorovich et al. | 324/762.03 |
| 6,911,827 B2* | 6/2005 | Kantorovich et al. | 324/615 |
| 7,051,306 B2* | 5/2006 | Hoberman | G06F 1/3203 716/127 |
| 7,138,815 B1* | 11/2006 | Alexander et al. | 324/750.3 |
| 7,203,608 B1* | 4/2007 | Aikawa et al. | 702/57 |
| 7,599,299 B2* | 10/2009 | Goetting et al. | 370/241 |
| 7,720,667 B2 | 5/2010 | Chaudhry et al. | |
| 2005/0050494 A1 | 3/2005 | McGuffin et al. | |
| 2005/0192773 A1* | 9/2005 | Sheng | G01K 7/42 702/132 |
| 2006/0125470 A1* | 6/2006 | Chen | G01R 31/3012 324/750.3 |
| 2008/0293449 A1* | 11/2008 | Barlow et al. | 455/556.1 |
| 2008/0307240 A1* | 12/2008 | Dahan et al. | 713/320 |
| 2009/0153324 A1* | 6/2009 | Goodnow | G01R 31/31721 340/540 |
| 2009/0168462 A1* | 7/2009 | Schopfer et al. | 363/21.01 |
| 2011/0157956 A1* | 6/2011 | Rotem | G01R 31/3004 365/94 |
| 2016/0267032 A1* | 9/2016 | Rigetti | G06N 99/002 |

OTHER PUBLICATIONS

Zheng-Hui, et al., "Introduction to IC RT-Level Power Estimation Methods", Chinese Scientific Journals Database, Circuits and Systems, vol. 1, 2004 (English Abstract Only) (2 pages).

* cited by examiner

MEASURING POWER CONSUMPTION IN AN INTEGRATED CIRCUIT

PRIOR FOREIGN APPLICATION

This application claims priority from European Patent Application No. 10191823.3, filed Nov. 19, 2010, which is hereby incorporated herein by reference in its entirety.

BACKGROUND

The present invention relates generally to integrated circuits, and in particular, to a method and system for measuring local electrical power consumption in an integrated circuit. The method may be used in electronic circuit design, as well as for performing self-tests in integrated circuit chips.

In the design and during operation of electronic systems, power consumption is an important parameter to be considered. On the one hand, "Green IT" calls for total energy consumption of electronic systems to be minimized. On the other hand, local power consumption within the electronic system is a crucial factor to take into account if overheating and thus malfunction of the system is to be avoided. In order to ensure reliable functionality, local power consumption within the system has to be assessed so that adequate cooling can be applied both locally and globally. This is especially true in high-end integrated circuits (ICs) where electronic components are closely packed and may consume considerable electrical power during operation. These types of electronics require cooling functionalities which need to be carefully designed, located and dimensioned according to the system's prospective local power consumption during typical activities.

Power consumption is an especially important parameter in high end VLSI (very large scale integration) chip designs, since all components have to be placed and spaced in such a way that they can be provided with adequate local cooling at any time during system operation. Failure analysis based on (local) power dissipation and/or local temperature is therefore becoming more and more important, e.g., for optimizing packaging density, energy efficiency, etc. In an effort to ensure that the IC under consideration will operate as desired, models of the (local) power dissipation within the IC are synthesized and used for modeling in order to determine whether the actual power distribution within the IC and its cooling is sufficient to meet certain design requirements. The validity of these models needs to be verified by taking real-world (i.e., physical) measurements of the actual power dissipation within the design. It is thus desirable to be able to accurately measure local power consumption in an electronic system comprising integrated circuits and to estimate prospective power consumption during the early stages of the system design, preferably during integrated circuit design.

The verification of power consumption associated with specific activities and load situations of the chip requires a measurement technique which yields reliable power data for individual VLSI (very large scale integration) chips/circuits as a whole or one or more parts of them. These data may then be used for verifying the anticipated system power and cooling requirements, as well as to model hardware to verify the individual power consumption for certain system load situations. The measurements have to be accurate and activity-related in the sense that they should furnish information on actual power demand of specific hardware activities in a system environment.

Various methods of measuring power consumption of an electronic system are known. For example, local power consumption within an IC chip may be estimated using on-chip thermal sensors. These sensors measure temperature within the chip and are thus capable of detecting regions of increased power consumption, so-called "hot spots". However, the measurements of thermal sensors represent time and location averages of the actual power consumption of the chip and therefore only yield indirect feedback, and are not capable of furnishing activity-specific and time-resolved data.

Power consumption in a part of an electronic circuit can be measured directly by simultaneously measuring time domain voltage U and current I within this part of the electronic circuit and calculating $P=U*I$. In particular, average power consumption can be evaluated based on measurements of average voltage and average current during specific hardware operation in a steady state system environment. This quasi-static method, however, only yields a time average of power consumption and cannot furnish time resolved data necessary for verifying a modeled and simulated time domain power consumption spectrum.

If a time resolved measurement of the power consumption is required, current and voltage have to be determined with the appropriate temporal resolution. While time-resolved on-chip voltage measurements are state of the art during chip operation and yield reliable results, on-chip power supply current measurements—if they are possible at all—systematically impact the power supply path and are thus inherently error-prone. As an example, current measurement based on the Hall effect (i.e., measurement of magnetic field using a GMR sensor) will yield a spatial average on a scale which, in general, is much larger than the spatial extent of a specific chip region under consideration.

U.S. Pat. No. 7,138,815 describes an on-chip self test system capable of measuring voltage between on-chip test points during a current discontinuity. The current discontinuity may be generated by turning on a first configurable logic block and then, after a selected period, turning on a second configurable logic block to create a current waveform. The resulting voltage and current data may be used for evaluating the chip's impedance profile. A different method for determining impedance profiles at different locations in a chip is described in U.S. Pat. No. 6,768,952. In this method, the chip is activated by different codes that, when executed, produce constant current levels. Subsequently, the clock frequency is toggled, thus creating a periodic current waveform, and the resulting voltage is measured. The impedance profile is calculated from the Fourier transform of the measured voltage and the Fourier transform of the periodic current waveform.

While on-chip measurement methods for determining impedance profiles of an integrated circuit chip are available, these do not furnish data on the chip's local power consumption. Thus, there is a need for an accurate method for determining time resolved power consumption in conjunction with a specific activity executing in a specific region of an electronic circuit. This method should be applicable to model-to-hardware verification during electronic circuit design and therefore should yield quantitative results and provide guidance to specific improvements. This method should also be adaptable to be used as part of a self test mechanism within the electronic circuit and thus enable fast and inexpensive manufacturing tests as well as providing power sanity checks during operation.

BRIEF SUMMARY

According to one aspect of the invention, a method of determining time resolved power consumption in a power domain within an integrated circuit is provided. The method includes: (1) determining a local power supply impedance profile of the power domain, (2) measuring a local time resolved power supply voltage while executing a periodic activity specific to the power domain, (3) evaluating a frequency spectrum of the measured local power supply voltage, (4) calculating an associated current spectrum from the voltage profile and the impedance profile, and (5) determining a power consumption spectrum from the current spectrum and the measured voltage spectrum.

According to another aspect of the invention, a system for determining power consumption in power domain within an integrated circuit is provided. The system includes (1) memory for storing a local power supply impedance profile of the power domain, (2) an Activity Stimulation System for executing a periodic actively specific to the power domain, (3) a Voltage Measurement System for measuring a local power supply voltage of the domain, (4) a Fourier Transform System for evaluating a power supply voltage profile as well as for calculating a current spectrum from the impedance profile and the voltage profile, and (5) a Power Evaluation System for determining a power consumption spectrum.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
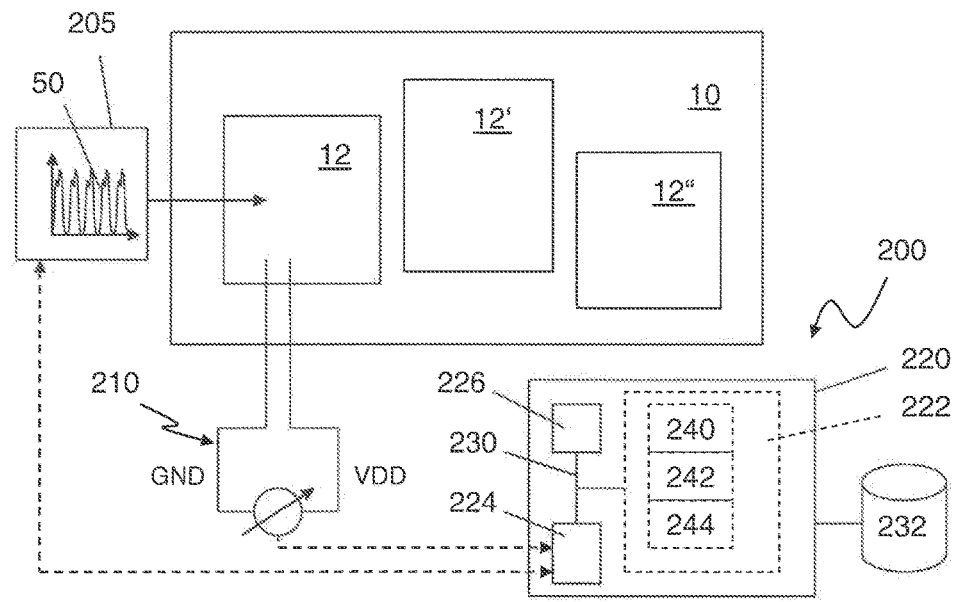
FIG. 1A is a schematic plan view of an integrated circuit chip and one embodiment of a system for evaluating the power consumption associated with a specific activity in a specific power domain within this chip, in accordance with one or more aspects of the present invention.

Note that, in the drawings, like elements are referred to with equal reference numerals. The drawings are merely schematic representations, not intended to portray specific parameters of the invention. Moreover, the drawings are intended to depict only typical embodiments of the invention, and therefore should not be considered as limiting the scope of the invention.

Unless otherwise indicated, the term "power domain" is used herein to denote an area within a chip or within an electric circuit which is self-contained with respect to power supply so that its supply voltages VDD and GND may be separated from the supply voltages of other areas within the electric circuit.

FIG. 1 displays a schematic plan view of an integrated circuit (IC) chip 10 comprising a power domain 12 whose power consumption characteristics as a function of time (P(t)) are to be evaluated. In what follows, the term "power domain 12" is used to notify an area of chip 10 which is self-contained with respect to supply voltage; this means that supply voltages VDD and GND of this specific power domain 12 are physically separated from supply voltages VDD and GND of other power domains 12', 12". In high performance chip design, it is general practice to partition the chip 10 into multiple power domains 12, 12', 12" with individual power supplies VDD, GND which can be turned off whenever the respective power domain is not in use, thus economizing power consumption and reducing heat generation in the chip 10. Different power domains 12, 12', 12" may be operating at different power levels, thus enabling integration of a large variety of functionalities into a single chip 10.

As an example, power domain 12 may be a specific hardware element residing on chip 10. Alternatively, power domain 12 may be a region which is activated when a specific software function is executed; for example, power domain 12 may be a specific arithmetic unit of chip 10. Note that different power domains 12, 12' of integrated circuit 10 are disjunctive from each other in the sense that while a specific activity causes power consumption in power domain 12, it does not influence domains 12', 12" and vice versa. This means that, as far as power consumption is concerned, power domains 12, 12', 12" may be treated as independent. Depending on the functionality and design of chip 10, a given chip 10 may contain one single power domain 12 or multiple power domains 12, 12', 12".

In order to determine power consumption P(t) of a given power domain 12 within chip 10 during execution of a specific activity, power domain 12 has to be subjected to this activity, and voltage U as well as current I corresponding to this activity have to be evaluated. While local power supply voltage U(t) related to the activity can be measured easily as a function of time and transformed into the frequency domain, time-resolved measurement of local power supply current I(t) is difficult and error-prone.

According to one embodiment of the invention, this problem is circumvented by noting that the power supply impedance $Z(f)=F_f\{U(t)\}/F_f\{I(t)\}$, so that the current spectrum I(t) may in fact be calculated from the measured voltage U(t) if the impedance Z(f) is known. The power supply impedance profile $Z(f)=U(f)/I(f)$ of any given power domain 12 is—to a reasonably high degree of accuracy—an invariant, which means that the impedance spectrum Z(f) of any activity executing in power domain 12 will be approximately the same, irrespective of the specifics of this activity. This is due to the fact that power supply impedance profile Z(f) is a specific property of the distribution network of power domain 12; it is location specific in the sense that impedance profiles Z(f) of different power domains 12, 12', 12" will typically display a different behavior. Z(f) of power domain 12 is a function of frequency f and is determined by packaging infrastructure, decoupling hierarchy, individual local geometry as well as component interactions (resonances). Since impedance profile Z(f) depends only on the passive electronic components (wiring, resistors, capacitors, inductors, . . . ) which are independent of the activity applied to the power domain 12, Z(f) may be evaluated by subjecting power domain 12 to a specific—notably a simple—activity, i.e., an activity which enables accurate determination of the associated current and voltage spectra $I_0(f)$, $U_0(f)$. Once $Z(f)=I_0(f)/U_0(f)$ of power domain 12 has been determined, the current $I(t)=F_f^{-1}\{I(f)\}$ of any (arbitrary) activity of power domain 12 may be calculated from the associated power supply voltage spectrum $U(f)=F_f(U(t))$ measured for this activity from $I(t)=F_f^{-1}\{Z(f)/U(f)\}$, and power consumption of this activity of power domain 12 may be computed as $P(t)=U(t)*I(t)$.

Figure 2A:
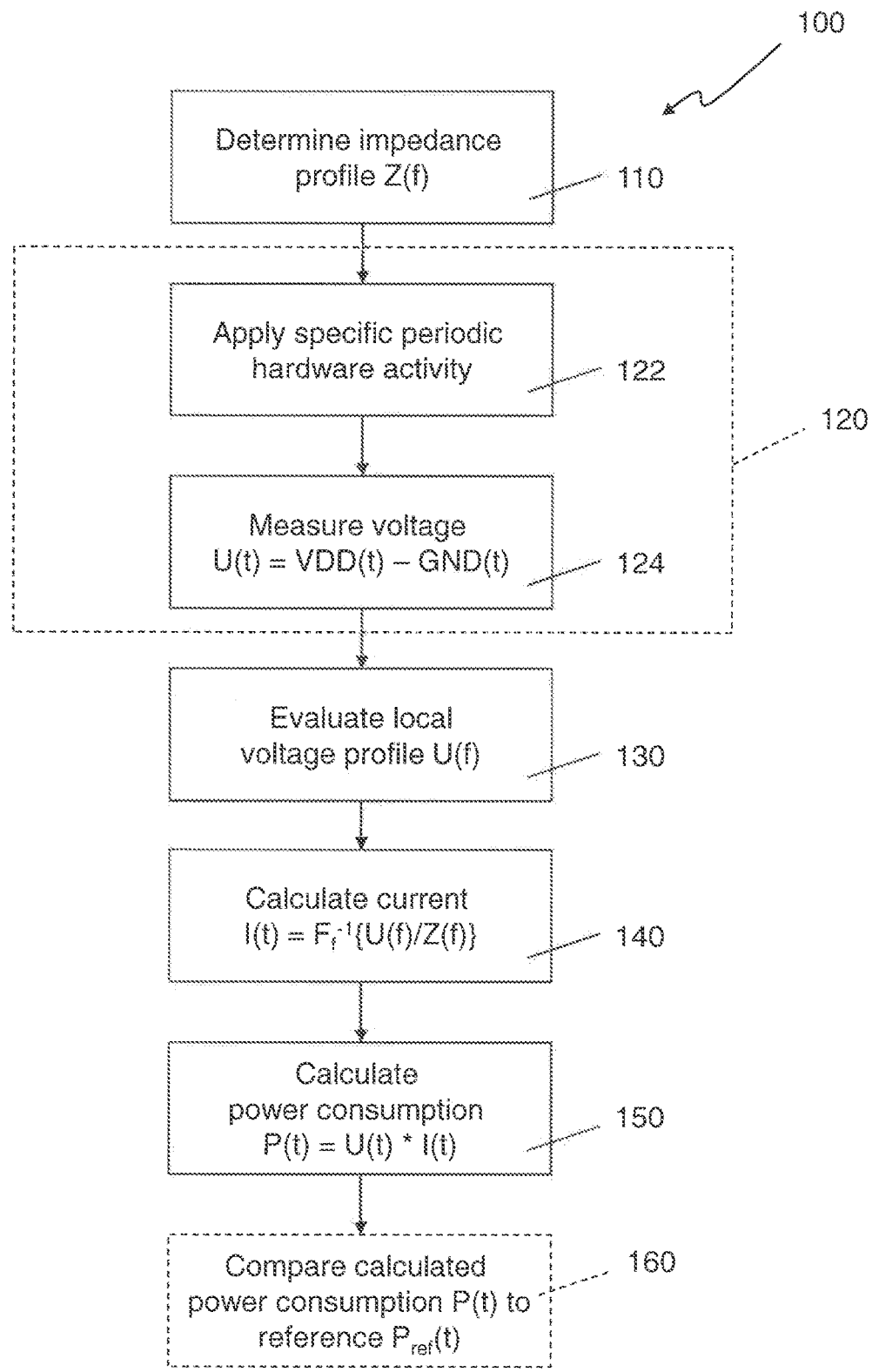
FIG. 2A is a schematic flow diagram of one embodiment of a method for determining a local power consumption profile for a specific activity in the integrated circuit chip of FIG. 1A or FIG. 1B, in accordance with one or more aspects of the present invention.
Figure 2B:
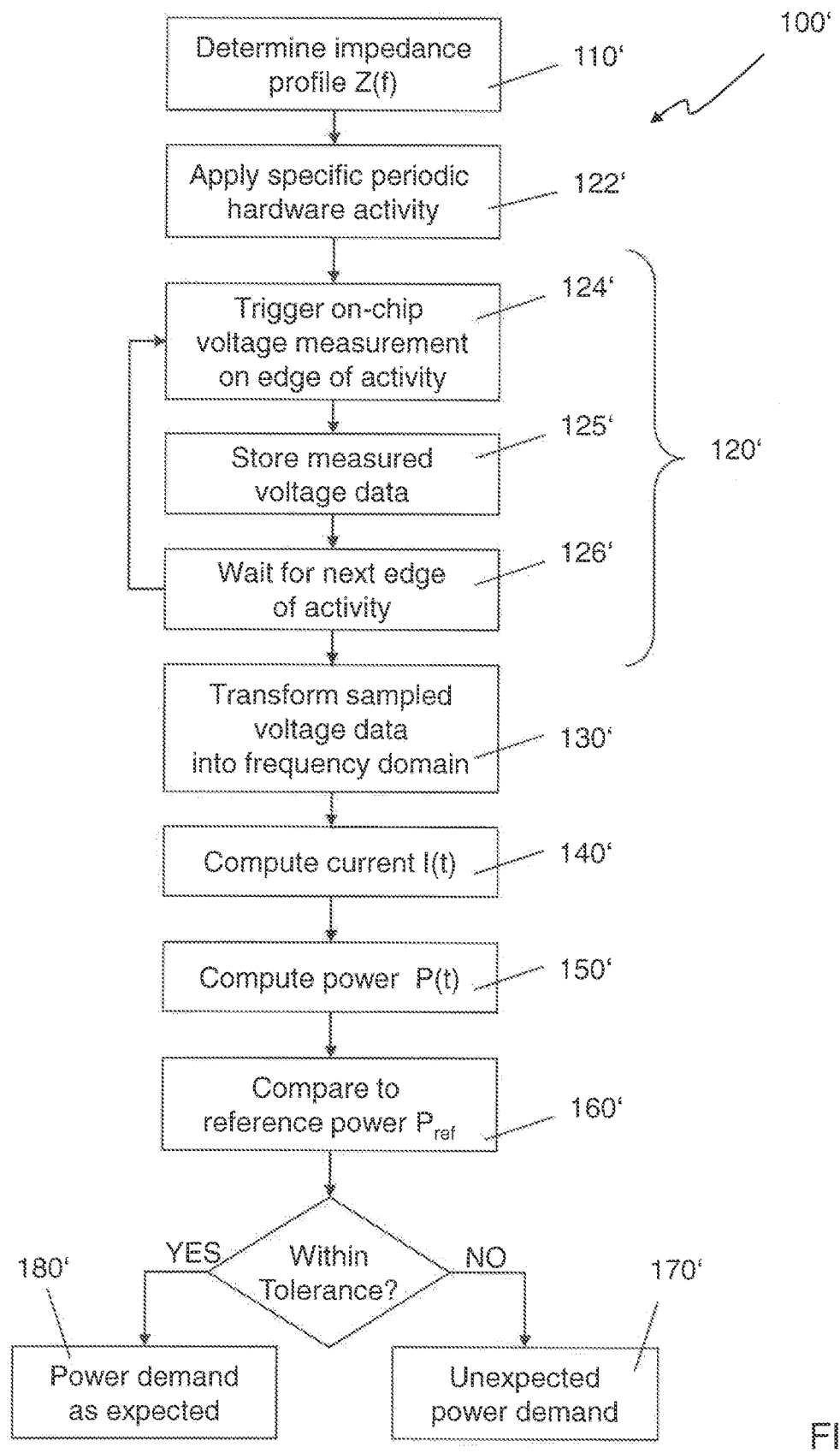
FIG. 2B is a schematic flow diagram of one detailed embodiment of the method of FIG. 2A, in accordance with one or more aspects of the present invention.

A schematic flow diagram of one embodiment of this method 100 for determining power consumption P(t) of a given power domain 12 within electronic circuit 10 as a function of time is shown in FIG. 2A. A schematic flow diagram of a detailed embodiment of this method is depicted in FIG. 2B.

Figure 3A:
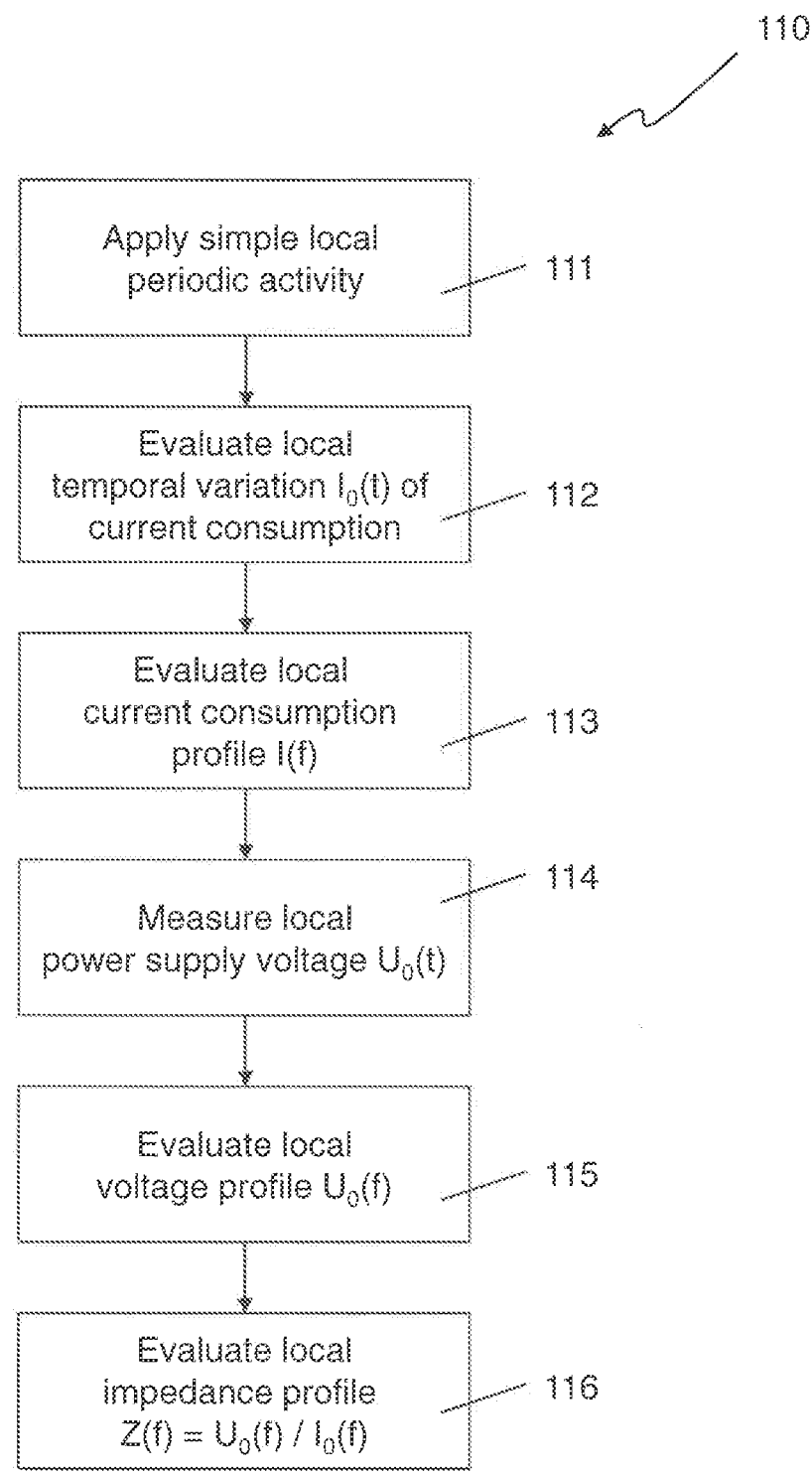
FIG. 3A is a schematic flow diagram of one embodiment of a method for determining a local power supply impedance profile of the power domain shown in FIG. 1, in accordance with one or more aspects of the present invention.

As outlined above, method 100 relies on local power supply impedance profile Z(f) of power domain 12 (step 110) which may be determined by subjecting this power domain to a very simple activation of which the current spectrum is especially easy to determine. One method for obtaining this local power supply impedance profile Z(f) of domain 12 is depicted schematically in flow diagram 110 of FIG. 3A. According to this method 110, a simple periodic activity (such as a periodic toggling of the clock tree) is applied to power domain 12 (step 111), causing a well-defined amount of power to be dissipated in power domain 12 under consideration. This simple periodic activity is chosen in such a way that the current consumption $I_0(t)$ due to this well-defined, periodically varying load can be easily calculated. In one embodiment, this simple periodic activity consists in periodically switching on and off the clock tree, so that the clock tree (of frequency $f_{clk}$) is superposed with a 100% amplitude modulation of frequency $f_{mod}$. Clock toggling is known to generate a high percentage of maximum dynamic current consumption in a typical IC and thus constitutes a well-suited excitation of power domain 12.

Figure 3B:
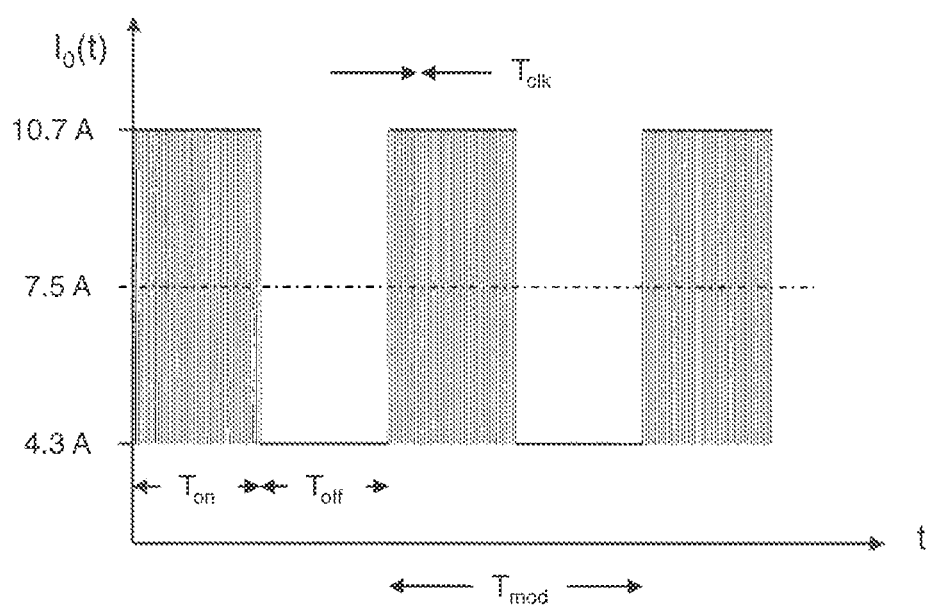
FIG. 3B is a schematic diagram of local current consumption due to a clock activity which is symmetrically switched ON and OFF, in accordance with one or more aspects of the present invention.

FIG. 3B shows a schematic diagram of a current consumption $I_0(t)$ due to an excitation by a clock signal modulated with a square wave. In this example, clock signal has frequency $f_{clk}=800$ MHz and is periodically modulated (i.e., switched ON and OFF) with a square wave of modulation frequency $f_{mod}=1$ MHz.

The local temporal variation $I_0(t)$ of current consumption due to this square wave modulated clock excitation may be expressed as:

$$I_0(t) = \left(I_0^{leak} + I_0^{ampl}\right) + \qquad\qquad\qquad (A)$$
$$I_0^{ampl} \cdot \left(\frac{4}{\pi} \cdot \sin\Omega_{mod}t + \frac{4}{3\pi} \cdot \sin3\Omega_{mod}t + \frac{4}{5\pi} \cdot \sin5\Omega_{mod}t + \ldots\right)$$

where $I_0^{leak}$ is the leakage current (which, in the example of FIG. 3B, amounts to 4.3 A), and $I_0^{ampl}$ is half the current amplitude (in the example of FIG. 3B, $I_0^{ampl}=3.2$ A).

The power supply current demand of both modulation states (i.e., parameters $I_0^{leak}$ and $I_0^{ampl}$) can be determined from a quasi-static measurement: current $I_0^{leak}$ may be obtained from a current measurement without clock activity, whereas $I_0^{ampl}$ may be obtained from a current measurement with a continuously operating clock.

Once $I_0(t)$ has been evaluated (step 112, see FIG. 3A), current consumption spectrum $I_0(f)$ may be calculated by Fourier series expansion (step 113). The signature of the local on-chip power supply voltage $U_0(t)$ encountered during the simple periodic activity in power domain 12 is determined by carrying out a set of voltage measurements (step 114). Subsequently, this set is transformed into frequency domain (step 115), yielding a power supply voltage spectrum $U_0(f)$ of the simple periodic activity applied to power domain 12. Finally, the local power supply distribution impedance profile Z(f) of domain 12 is computed (step 116) as the ratio of voltage spectrum $U_0(f)$ and current spectrum $I_0(f)$.

The evaluation of impedance profile Z(f), being a parameter specific to the power domain 12 under consideration (but invariant with respect to the various activities which may execute in this power domain 12), forms the outset (step 110) of method 100 (FIG. 2A) for determining the power consumption profile of a given activity applied to power domain 12 on chip 10. Note that Z(f) is generally a complex function comprising a real part $Z^{re}(f)$ and an imaginary part $Z^{im}(f)$:

$$Z(f)=Z^{re}(f)+i*Z^{im}(f)=|Z(f)|*e^{i\phi} \qquad\qquad (B)$$

where $|Z(f)|$ is the magnitude of Z and $\phi$ is its phase.

In step 122 of method 100, a specific periodic activity 50 is applied to this power domain 12, and the local power supply voltage U(t) associated with this activity is measured (step 124), e.g., by using an oscilloscope 210. The periodic activity 50 may, for example, comprise ADD, MULTIPLY, SUBTRACT etc. and is specific to power domain 12. As shown in FIG. 1, the power supply voltage U(t) measurement may be carried out by connecting supply leads 34 of power domain 12 to oscilloscope 210 and determining the difference between VDD and GND as obtained from voltage measurements of oscilloscope 210. Once U(t) has been determined, a Fourier transform of U(t) into frequency domain yields supply voltage spectrum U(f) (step 130). Subsequently, current $I(t)=F_f^{-1}\{I(f)\}$ may be calculated by noting that $I(f)=U(f)/Z(f)$ (step 140), and power consumption may be calculated from $P(t)=U(t)*I(t)$ (step 150). The power consumption P thus determined may be compared to a reference $P_{ref}$ obtained from an analytic or a numerical simulation of the electronic design under consideration (step 160).

FIG. 1A schematically shows a system 200 for determining a power consumption P(t) corresponding to a specific periodic activity 50 applied to power domain 12 of chip 10. System 200 comprises a signal generator/modulator 205 for applying repetitive activity 50 to power domain 12 as well as an oscilloscope 210 for measuring local power supply voltage U(t) as caused by this activity 50. Moreover, system 200 comprises a computer system 220 with memory 222, input/output (I/O) interfaces 224, a central processing unit (CPU) 226, bus 230 and data base 232. Memory 222 may comprise any known type of data storage and/or transmission media and may reside at a single physical location, comprising one or more types of data storage. I/O interface 214 is used for exchanging information with oscilloscope 210 and signal generator/modulator 205. Bus 230 provides a communication link between each of the components in the computer system 220. In addition, although not shown, additional components such as external devices/resources, cache memory, communication systems, system software etc. may be incorporated into computer system 220.

Database 232 provides storage for information necessary to carry out the present invention. Such information could include e.g., impedance spectra Z(f) for the power domain 12 under consideration, activity pattern 50 etc.

Stored in memory 222 is a logic system comprising Activity Stimulation System 240, Fourier Transform System 242 and Power Evaluation System 244. These systems carry out the functions described above:

Activity Stimulation System 240 is used for generating specific periodic activity 50 which is to be applied to power domain 12 by signal generator/modulator 205;

Fourier Transform System 242 is used for managing voltage data acquired by oscilloscope 210 on power domain 12 and for evaluating a voltage profile U(f) from these measurement data, for calculating current spectrum I(f)=U(f)/Z(f) as well as for transforming this current spectrum I(f) back into the time domain;

Power Evaluation System 244 is used for evaluating the power consumption P(t)=U(t)*I(t).

Method 100 comprises a reliable method for assessing power consumption in a power domain 12 during execution of a predefined specific activity and can be used for a quantitative evaluation of power demand over a large frequency range. Power consumption P(t) as determined by method 100 for any given activity in given power domain 12 may be compared to simulations and/or analytical models of power consumption for this activity and this power domain 12, thus verifying or refuting design properties of electronic circuit 10. In particular, the specific activity for stimulating power domain 12 may be chosen such that it can easily be modeled. Method 100 may be applied during chip and module test for early design feedback on power demand and thermal properties: using method 100, prototype chips may be evaluated with respect to their local energy consumption at an early stage during IC design, so that, for example, 3D packaging may be improved, power supply may be sized correctly, cooling resources may be placed and dimensioned appropriately etc. By accumulating P(t) over a characteristic time of selected hardware operations, this yields a precise value of the totally consumed energy for these selected hardware operations in the respective power domain 12, which in turn can be used for power optimization during chip/system design.

As outlined above, method 100 is based on the assumption that power supply impedance profile Z(f) is an invariant with respect to activity, i.e., is independent of the kind and amount of ambient activity executing in voltage domain 12. While this is generally a good approximation, some deviations may occur under certain operating conditions (e.g., due voltages influencing leak currents etc.) and may adulterate the results.

When used for power consumption verification during integrated circuit design, method 100 will yield information on whether a specific chip/circuit 10 for which the method 100 is executed complies with a reference model of this chip/circuit 10 (see step 150). Note that impedance profile Z(f) of power domain 12 in chip 10 is—to a good approximation—invariant with respect to inaccuracies/variations occurring in the chip manufacturing process (oxide layer thickness, doping variations etc.). Thus, measurements taken on a specific chip 10 and verification results obtained by method 100 can be used for assessing prospective properties of different individual chips and of different manufacturing batches. Conversely, results obtained by method 100 may be used as a basis for adjusting design properties and/or manufacturing features of the chip under consideration.

Method 100 relies on the assumption that voltage domain 12, for which the power supply impedance Z(f) and the power consumption P(t) are calculated, is not influenced by other voltage domains 12', 12" and thus may be treated independently of them. Moreover, it relies on the assumption that the conditions under which Z(f) is determined (step 110) are the same as the conditions under which U(t) is measured (step 120). As a consequence, accurate determination of power supply impedance Z(f) and power supply voltage U(t) of specific activity in voltage domain 12 requires that other voltage domains 12', 12" be isolated from voltage domain 12 under consideration (or be switched off) in order to avoid interferences and distortions in the power supply impedance Z(f) as calculated by method 110 (FIG. 3A) and in the power supply voltage U(t) as measured in step 120.

Besides furnishing useful information during circuit design, method 100 is also applicable in a system environment for verifying system performance, e.g., as part of hardware verification during machine bring-up. In this case, power consumption is assessed using an on-chip self-test system 200', as shown schematically in FIG. 1B. When self-test system 200' is activated, it will perform a self-test routine on one (or several) power domain(s) 12 of chip 10. This self-test routine may encompass an evaluation of local power consumption of power domain 12. A flow diagram of one embodiment of this evaluation method 100' is shown in FIG. 2B.

In a first step 110', impedance profile Z(f) is determined for power domain 12 of chip 10 and stored in a storage 232' within on-chip self-test system 200'. Impedance profile Z(f) may be evaluated using method 110 depicted in FIG. 3A. Subsequently, selective hardware operations 50 are periodically executed (step 122'). With this selective periodic activity 50 applied to power domain 12, local voltage measurements at power domain 12 are performed (steps 124' to 126'). Electrical connections 34 linking self-test system 200' to power domain 12 enable VDD and GND measurements to be carried out by a measurement system 210' within self-test system 200'. Measurement loop 120' is iterated a predetermined number N of times, so that N voltage measurements are taken at consecutive times $t_j$ (j=1, . . . , N), yielding local voltage values $U_j$=VDD($t_j$)−GND($t_j$). The measurements are triggered at the edge of the periodic activity 50 (step 122'), and the values of $U_j$ thus obtained are digitized in A/D converter 215' and stored in storage 232' of on-chip self-test system 200' (step 125'). Once a set of voltage values $U_j$ (j=1, . . . , N) has been accumulated, this set is transformed into frequency domain (step 130') in Fourier Transform unit 242', yielding a power supply voltage spectrum U(f) of periodic activity 50 executing in power domain 12 within chip 10. Note that storage 232' has to be dimensioned in such a way that it can store a full sample set of measurement values.

Once the power supply voltage spectrum U(f) has been determined (step 130'), it can be used—together with impedance Z—for calculating the associated current I(t)=$F_f^{-1}${U(f)/Z(f)} (step 140') and the power consumption P(t) of activity 50 in power domain 12 on the chip 10 (step 150').

The actual power consumption, as computed in step 150', may be compared with a reference $P_{ref}$ stored in storage 232'. Reference $P_{ref}$ is characteristic of "normal" power consumption associated with activity 50 in power domain 12 (step 150'). In this context, the term "normal" power consumption in power domain 12 designates a power consumption which is low enough to ensure good functionality without overheating. The comparison between actual power consumption P and reference $P_{ref}$ takes place in Comparator 246' within self-test system 200' and may be formed by subtraction: if the difference $\Delta=P-P_{ref}$ between actual and reference power consumption profiles exceeds a predetermined threshold, this is indicative of excessive power consumption in power domain 12 (step 170'); if, on the other hand, the actual power consumption P displays only minor differences from reference signature $P_{ref}$, this indicates that power consumption in power domain 12 concurs with specification (step 180').

Figure 1B:
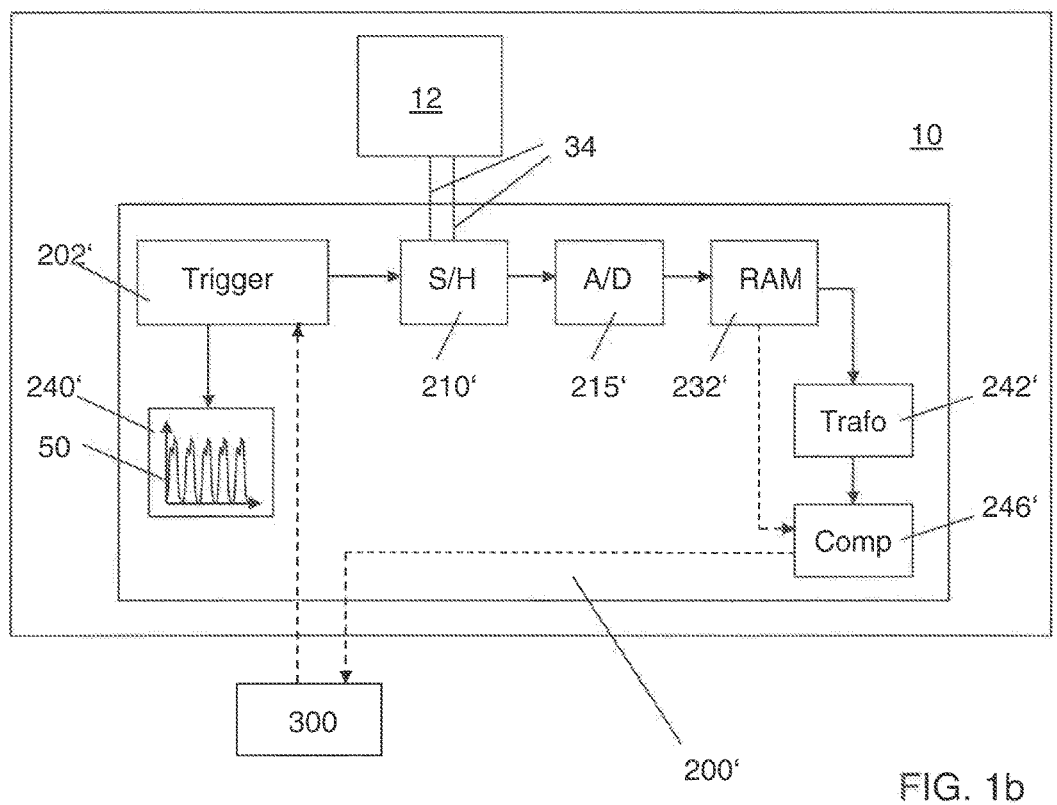
FIG. 1B is a schematic plan view of an integrated circuit chip with an on-chip system for evaluating local power consumption within this chip, in accordance with one or more aspects of the present invention.

As shown schematically in FIG. 1B, on-chip self-test system 200' comprises a trigger unit 202' for starting (and terminating) periodic activity 50 which is generated by Activity Stimulation System 240'. While periodic activity 50 may be created in unit 240' on chip 10, it may also be generated in a location off chip 10, e.g., in an external unit 300. Whenever trigger unit 202' is activated (e.g., by receiving a trigger signal from system self-test unit 200', for example, during system start-up, or by starting periodical (automatic) system self-tests), trigger unit 202' triggers Activity Stimulation System 240' to initiate periodic activity 50 in power domain 12 and ensures that all other activities within power domain 12 are shut off. Subsequently, trigger unit 202' triggers measurement module 210' to acquire local voltage data $U_i$ which are stored in storage unit 232'.

By connecting self-test system 200' to several power domains 12, 12', 12" within chip 10, method 100' may be carried out for multiple locations (concurrently or consecutively). Self-test method 100' thus can be used for determining whether local power consumption within chip 10 concurs complies with a pre-determined specification. If P is found to deviate from reference $P_{ref}$ in one or several power domains, corresponding control flags may be put up in on-chip self-test system 200' and/or control signals may be sent to a system self-test unit 300 indicating that power domain 12 is consuming excessive power and may be overheating (i.e., developing a "hot spot"). Based on this information, system self-test unit 300 may issue a warning to system user and provide information on the specific chip 10 and/or power domain 12 in which the deficiency was detected. Note that since method 100' is capable of detecting unexpected power demand peaks, self-test system 200' may also be used for power glitch detection. Continuous power demand sampling and recording may be executed, and the results may be analyzed by recovery code after an incident.

Note that some functions of self-test unit 200' such as storage 232' as well as Comparator 246' may reside (fully or partly) in a different location (i.e., outside chip 10, e.g., on a motherboard of a computing system which chip 10 forms part of). Storage 232' is in one embodiment located on chip 10 since a fast RAM access is required for on-line storage of measurement values.

Note from the above description that the present invention provides a method and a system for accurately determining time resolved power consumption in a specific power domain within an integrated circuit. In particular, the method enables a fast and accurate assessment of the local power consumption profile up to high frequencies.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs.

As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method comprising:
 determining power consumption of one power domain of multiple power domains within an integrated circuit, said determining comprising:
  electrically connecting a test system to said one power domain of the multiple power domains of the integrated circuit, the test system comprising a voltage measurement system;
  determining, by the test system, a local power supply impedance profile (Z(f)) specific to said one power domain of the multiple power domains of the integrated circuit;
  executing, by the integrated circuit, a periodic activity specific to said one power domain, wherein the periodic activity causes a defined amount of power to be dissipated in the one power domain;
  during the executing, measuring, by the voltage measurement system of the test system, a local power supply voltage (U(t)) for the one power domain;
  concurrent with the determining of the local power supply impedance profile (Z(f)) specific to said one power domain and the measuring, isolating one or more of the multiple power domains, from the one power domain, the isolating comprising preventing interferences or distortions of the one or more of the multiple power domains of the integrated circuit from influencing said one power domain during determining the local power supply impedance profile (Z(f)) specific to said one power domain and measuring the power supply voltage (U(t)), wherein the isolating does not comprise switching off the one or more of the multiple power domains;
  evaluating, by the test system, a voltage spectrum (U(f)) of said measured local power supply voltage (U(t)) for the one power domain;
  calculating, by the test system, an associated power supply current (I(t)) from said impedance profile (Z(f)) and said voltage spectrum (U(f)) for the one power domain;
  determining, by the test system, a power consumption spectrum (P(t)) for the one power domain of the multiple power domains within the integrated circuit from said power supply current (I(t)) and the measured power supply voltage (U(t)) for the one power domain; and based on the determining the power consumption spectrum (P(t)) for the one power domain of the multiple power domains, dimensioning and placing cooling resources to adequately cool the integrated circuit during operation.

2. The method of claim 1, wherein the executing the periodic activity comprises a repetitive activity of toggling a clock tree to generate a high percentage of maximum dynamic current consumption to excite the one power domain and wherein the determining said local power supply impedance profile of said one power domain comprises:

evaluating a temporal behavior of a current consumption ($I_0(t)$) caused by the repetitive activity;

calculating a corresponding current consumption spectrum ($I_0(f)$);

measuring a local power supply voltage ($U_0(t)$) for the one power domain caused by said repetitive activity;

evaluating a voltage spectrum ($U_0(f)$) of said measured local power supply voltage (U0(t)); and calculating said local power supply impedance profile (Z(f)) for the one power domain from said voltage and current spectra ($U_0(f)$, $I_0(f)$).

3. The method of claim 2, wherein the evaluating the temporal behavior of the current consumption ($I_0(t)$) comprises obtaining quasi-static measurements of a leakage current ($I_0^{leak}$) and a current amplitude ($I_0^{ampl}$) of the repetitive activity.

4. The method of claim 1, further comprising comparing the power consumption spectrum P to a reference spectrum $P_{ref}$.

5. The method of claim 1, wherein the method is carried out during integrated circuit power-on.

6. The method of claim 1, wherein the method is carried out periodically during integrated circuit operation.

7. A system comprising:

a test system for determining power consumption of one power domain of multiple power domains within an integrated circuit, the test system for determining comprising:

a memory for storing a local power supply impedance profile Z(f) specific to said one power domain of the multiple power domains of the integrated circuit;

an Activity Stimulation System for executing by the integrated circuit a periodic activity specific to said one power domain, wherein the periodic activity causes a defined amount of power to be dissipated in the one power domain;

a Voltage Measurement System for measuring a local power supply voltage (U(t)) of said one power domain and concurrent with the measuring, isolating one or more of the multiple power domains, from the one power domain, the isolating comprising preventing interferences or distortions of the one or more of the multiple power domains of the integrated circuit from influencing said one power domain during the storing and the measuring, wherein the isolating does not comprise switching off the one or more of the multiple power domains;

a Fourier Transform System for evaluating a voltage spectrum (U(f)) of said measured local power supply voltage (U(t)) and for calculating associated current (I(t)) from said impedance profile (Z(f)) and said voltage spectrum (U(f) for the one power domain; and a Power Evaluation System for determining a power consumption (P(t)) for the one power domain of the multiple power domains within the integrated circuit; and based on the determining the power consumption spectrum (P(t)) for the one power domain of the multiple power domains, dimensioning and placing cooling resources to adequately cool the integrated circuit during operation.

8. The system of claim 7, further comprising a Comparator for comparing said power consumption spectrum (P(t)) to a reference profile ($P_{ref}(t)$).

9. The system of claim 7, wherein the system is integrated into the integrated circuit.

10. The system of claim 8, wherein the Activity Stimulation System and the Voltage Measurement System reside on a chip with the integrated circuit, and the Comparator resides in a location outside the chip.

* * * * *